United States Patent
Kloesch et al.

(10) Patent No.: US 8,212,992 B2
(45) Date of Patent: Jul. 3, 2012

(54) DEVICE FOR DAMPING VIBRATIONS IN PROJECTION EXPOSURE APPARATUSES FOR SEMICONDUCTOR LITHOGRAPHY

(75) Inventors: Peter Kloesch, Oberkochen (DE); Michael Ringel, Oberkochen (DE); Markus Weiss, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/045,697

(22) Filed: Mar. 11, 2011

(65) Prior Publication Data
US 2011/0205507 A1   Aug. 25, 2011

Related U.S. Application Data

(63) Continuation of application No. PCT/EP2009/061917, filed on Sep. 15, 2009.

(30) Foreign Application Priority Data

Sep. 16, 2008   (DE) .......................... 10 2008 047 562

(51) Int. Cl.
*G02B 7/02* (2006.01)
*G03B 27/42* (2006.01)
*G03B 27/52* (2006.01)
*G03B 27/54* (2006.01)

(52) U.S. Cl. ................ 355/67; 355/30; 355/53; 359/819

(58) Field of Classification Search .......... 188/378–380; 355/30, 53, 67, 77; 359/507, 808, 811, 819–828
See application file for complete search history.

(56) References Cited

U.S. PATENT DOCUMENTS

| | | | |
|---|---|---|---|
| 5,656,882 A | 8/1997 | Lazarus et al. | |
| 6,036,162 A | 3/2000 | Hayashi | |
| 2002/0167740 A1 | 11/2002 | Osterried | |
| 2003/0197914 A1 | 10/2003 | Cox et al. | |
| 2007/0024829 A1 | 2/2007 | Mizuno | |
| 2007/0097340 A1* | 5/2007 | Yuan et al. ...................... 355/53 |
| 2007/0177122 A1 | 8/2007 | Loopstra et al. | |
| 2008/0285161 A1 | 11/2008 | Geuppert et al. | |
| 2008/0308749 A1* | 12/2008 | Butler ......................... 250/492.1 |
| 2008/0316444 A1 | 12/2008 | Sorg et al. | |

(Continued)

FOREIGN PATENT DOCUMENTS

DE       100 62 786       6/2002

(Continued)

OTHER PUBLICATIONS

The International Search Report and a Written Opinion from the counterpart PCT Application No. PCT/EP2009/061917, dated Nov. 18, 2009.

(Continued)

*Primary Examiner* — Hung Henry Nguyen
*Assistant Examiner* — Colin Kreutzer
(74) *Attorney, Agent, or Firm* — Fish & Richardson P.C.

(57) ABSTRACT

A changeable assembly for a projection exposure apparatus for semiconductor lithography contains at least one damping element. Projection exposure apparatus for semiconductor lithography and measuring assemblies for a projection exposure apparatus for semiconductor lithography can include at least one sensor for detecting parameters and vibrations of the projection exposure apparatus, wherein the measuring assembly is embodied in such a way that it can be inserted into an exchange opening, provided for an optical element, in the projection exposure apparatus.

14 Claims, 3 Drawing Sheets

U.S. PATENT DOCUMENTS

2009/0260654 A1  10/2009  Geuppert et al.

FOREIGN PATENT DOCUMENTS

| DE | 101 06 605 | 8/2002 |
|---|---|---|
| DE | 102 25 266 | 7/2003 |
| DE | 102 29 623 | 1/2004 |
| EP | 1 321 822 | 6/2003 |
| EP | 1 813 989 | 8/2007 |
| WO | WO 2005/010961 | 2/2005 |
| WO | WO 2006/084657 | 8/2006 |
| WO | WO 2008/049926 | 5/2008 |

OTHER PUBLICATIONS

The German Office Action with English translation for corresponding DE Appl No. 10 2008 047 562.9, Apr. 6, 2009.

* cited by examiner

DEVICE FOR DAMPING VIBRATIONS IN PROJECTION EXPOSURE APPARATUSES FOR SEMICONDUCTOR LITHOGRAPHY

CROSS-REFERENCE TO RELATED APPLICATIONS

This application is a continuation of PCT/EP2009/061917, filed Sep. 15, 2009, which claims priority to German Patent Application no. 10 2008 047 562.9, filed on Sep. 16, 2008. The entire contents of both applications are incorporated herein by reference.

BACKGROUND

The disclosure relates to a projection exposure apparatus for semiconductor lithography comprising a plurality of optical elements and a damping element for damping mechanical vibrations, and to a changeable assembly for a projection exposure apparatus for semiconductor lithography. Furthermore, the disclosure relates to a measuring assembly for a projection exposure apparatus. In this case, the mechanical vibrations discussed generally lead to impairments of the optical imaging quality of the systems discussed, said impairments being manifested for example as a loss of contrast and impairing the yield of semiconductor products having entirely satisfactory quality. The problem area mentioned is also aggravated in particular by the fact that during the lifetime of a projection exposure apparatus for semiconductor lithography, the process parameters with which the apparatus is operated are changed a number of times. By way of example, exposure times or advancing speeds of reticle and wafer stage change. The dynamic behaviour of the projection objective is not unaffected by these changes. Thus—depending on the process parameters mentioned—varying optical elements in the projection exposure apparatus are excited to effect natural vibrations. This makes it considerably more difficult for the damping system of a projection exposure apparatus to be designed optimally with regard to all possible use parameters from the outset.

SUMMARY

In certain aspects, the disclosure features a device which has, with regard to the damping of mechanical vibrations in projection exposure apparatuses for semiconductor lithography, improved flexibility with regard to possible use parameters of the apparatus.

Embodiments of projection exposure apparatus for semiconductor lithography have a plurality of optical elements and also a damping element for damping mechanical vibrations and contains a changeable assembly comprising at least one damping element; the damping element arranged in the changeable assembly can be the only damping element in the projection exposure apparatus for damping mechanical vibrations. The changeable assembly is embodied in such a way that the assembly can be changed in a time period of less than 12 h, in particular within approximately 10 h. After and before this time period, the projection exposure apparatus is fully operational, which means that the mentioned time period includes the calibration/adjustment of the apparatus, as well. In this case, the changeable assembly can be embodied as an insert element which can be inserted into an insert opening already present, whereby the rapid change of assembly that is striven for can advantageously be realized. In this case, the change process differs from the change of an optical element by the exchange of damping elements or the additional introduction of damping elements in receptacles such as threaded holes, for example, that are already present in the assembly. In this case, the introduction or the exchange of the damping elements themselves in the assembly usually takes up a time period of less than 10 minutes, often of approximately 5 minutes or less. In contrast to this, changing an assembly that is not arranged in an insert opening but rather screwed together with further components, in particular in the projection objective, would take up a time period of a number of days. In principle, the changeable assembly can be arranged practically at all points in the projection exposure apparatus, for example in an illumination device; however, a preferred installation location is the projection objective. In the case of an embodiment of the changeable assembly in an illumination device, the latter can also be embodied as a housing part.

The fact that the damping element is embodied as part of a changeable assembly results in increased flexibility with regard to adaptation to changing use parameters. For the case where the design of the damping element currently arranged in the changeable assembly no longer achieves satisfactory results for a given set of use parameters, the changeable assembly can be removed from the projection objective without relatively high outlay in terms of mounting and either an exchange of the damping elements can be performed or the entire assembly can be replaced by a different assembly including appropriately dimensioned damping elements.

In some embodiments, the changeable assembly additionally contains at least one optical element. In such cases, the optical element arranged in the changeable assembly can be mechanically connected to the damping element in such a way that vibrations of the optical element are damped by the damping element. As an alternative, the assembly can also be designed in such a way that the optical element and the damping element are merely arranged spatially in the same assembly, without directly interacting mechanically. In other words, in the last-mentioned case, the prime effect of the damping element does not reside in damping possible vibrations of the optical element arranged in the same assembly, but rather in damping vibrations affecting the entire projection objective or at least subassemblies thereof. The fact that the changeable assembly contains an optical element means that, in some embodiments, a retrofitting solution can be realized. In such cases, the retrofitting solution includes embodying the changeable assembly in a form such that it can be inserted into insert openings in objectives which have hitherto only been designed for receiving changeable mounts with optical elements. This opens up the possibility of projection objectives also being subsequently provided with an additional damping functionality by the use of the changeable assembly. Since the changeable assembly still bears the optical element originally provided, its action is unchanged from an optical standpoint, with the difference that it now fulfils an additional damping function. In this context, it may be particularly advantageous to employ the solution presented above for a changeable assembly in the region of a pupil plane of the projection objective.

The damping element can be embodied as a passive damping element; in particular, it can have a mass element connected to an elastic element.

In such cases, the elastic element can be connected to the mass element in such a way that the damping element can perform a shear movement. In such cases, the advantage of the shear movement is that the mechanical vibration energy is dissipated, that is to say converted substantially into heat, the most effectively in the case of a shear vibration of the damping element.

For the mass element, a mass in the range of 150 g-450 g, in particular in the range of 250 g-350 g, has proved to be worthwhile.

The elastic element can be produced from a fluoroelastomer, in particular a fluororubber. The materials mentioned are distinguished by their high stability in particular under vacuum conditions; it should be highlighted in this context that the fluoroelastomers exhibit a very positive outgassing behaviour.

In contrast to a passive embodiment of the damping element, the latter can also be embodied as an active damping element with a sensor and an actuator. In this case, the sensor records for example the deflection or the acceleration of a component to be damped. Afterwards, the output signal of the sensor, having been correspondingly amplified and phase-shifted, can be fed to the actuator again.

In such cases, the damping element can contain a plunger-type coil. The plunger-type coil can in this case be used both as sensor and as actuator. In this case, the choice of use can be made exclusively using the driving of the plunger-type coil; thus, by way of example, in a first measurement cycle using the plunger-type coil as a sensor, that is to say by measuring the output signal of the plunger-type coil, it is possible to determine the frequency and amplitude of a disturbing vibration. After evaluation of the parameters of the disturbing vibration in an evaluation unit, it is subsequently possible to generate a signal shape using which the detected vibration can be damped the most efficiently. A damping cycle subsequently ensues, that is to say that the calculated signal is applied to the plunger-type coil and the latter is operated as an actuator that damps the vibration determined. In this case, it need not necessarily be a plunger-type coil that is used as sensor and/or actuator; the procedure outlined is possible, in principle, with all components that can be used as sensor or actuator. In this respect, piezoelements, eddy current brakes/sensors or capacitive sensors/actuators may also be mentioned by way of example. Using the measures outlined above, components can be saved and this means that firstly the complexity of the system can be reduced and secondly the structural space taken up by the damping element can be kept small.

In certain embodiments, the damping element can be realized using piezoelements, in particular as an actuator in the manner of the piezo-actuator described in the published German patent application DE 100 225 266 A1. The document cited describes an actuator in which the actuator rotor (that is to say the moving part of the actuator, which generally acts on the component to be manipulated or to be positioned) is driven on using one or more advancing elements ("feet") which are realized as piezoelements and are perpendicular to the rotor. In such cases, the advancing elements move perpendicular to their own longitudinal direction in the rotor direction. In such cases, the actuator described can be operated in a mode in which the advancing elements remain on the actuator rotor instead of moving the rotor by setting down, advancing and drawing back. This variant opens up the possibility that an actuator which can also be used for manipulating the position of an optical element can be used as a vibration damper in an alternative or additional operating mode. The advantage particularly of the use of piezoelements in this case is that the latter have a comparatively high bandwidth, usually in the range of 0 to 2000 Hz.

For carrying away the dissipated mechanical energy or for cooling possible active components of the damping element, the latter can be provided with a cooling device, in particular a gas or liquid cooling device or else a heat pipe. In such cases, the cooling device has the effect that the dissipated energy leaves the region of the projection objective and does not contribute to heating of the components of the objective. In particular, the use of a cooling device has the effect that the temperature of the damping element is kept stable and, consequently, the mechanical properties of the damping element do not change, or change only slightly, over time. In some embodiments, the purge gas that is used in the projection objective anyway in order to avoid contaminations can be used for cooling the damping element.

It has been found that efficient damping can be achieved when the damping element is designed for damping vibrations having a frequency in the range of 10 Hz-800 Hz. The frequencies mentioned occur particularly frequently during the operation of projection exposure apparatuses for semiconductor lithography.

The natural frequency of the damping element can be approximately 95% of a natural frequency of the projection objective.

In order to optimally prepare for the change of the damping elements in the case of a necessary adaptation, it may be advantageous to provide a measuring assembly equipped with at least one sensor for detecting parameters of vibrations of the projection objective. In this case, the measuring assembly can be embodied in such a way that it can be inserted into an exchange opening, provided for an optical element in the projection objective. In some embodiments, the measuring assembly discussed contains that optical element which is provided anyway for the corresponding process during semiconductor production, such that the measuring assembly does not influence the optical properties of the projection objective. The vibrations of the projection objective can thus be recorded under realistic use conditions. The parameters determined subsequently serve for designing a passive or else active damping unit optimally with regard to the corresponding process and the typical vibrations associated therewith.

As an alternative or in addition, the measurement mentioned can also be effected using the sensor system of the apparatus itself or on the basis of a diagnosis of a wafer.

BRIEF DESCRIPTION OF THE DRAWINGS

Embodiments are discussed below with reference to the following drawings.

DETAILED DESCRIPTION

Figure 1:
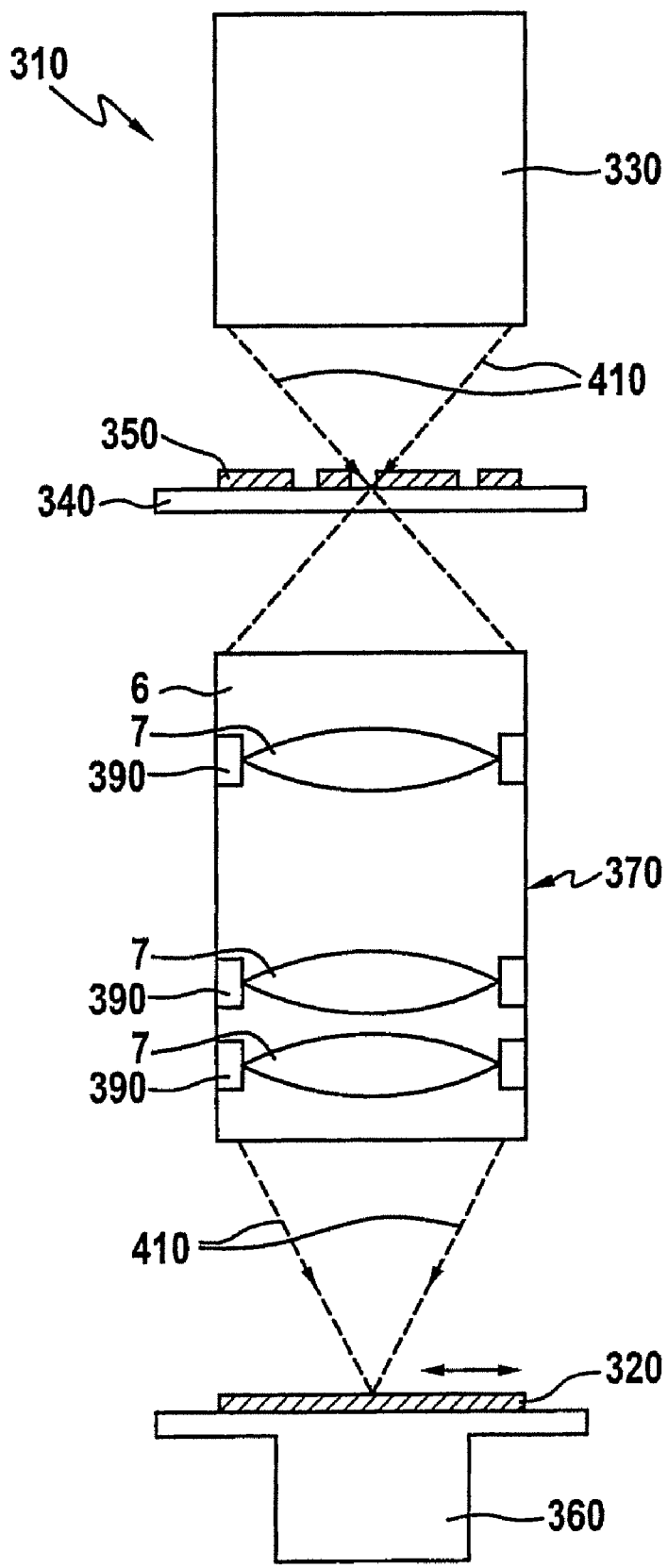
FIG. 1 shows an embodiment of a projection exposure apparatus 310 for semiconductor lithography.

FIG. 1 illustrates a projection exposure apparatus 310 for semiconductor lithography. In this case, the illustration in FIG. 1 serves only as an overview of the overall system. The apparatus serves for exposing structures onto a substrate coated with photosensitive materials, said substrate generally predominantly being composed of silicon and being referred to as a wafer 320, for the production of semiconductor components such as computer chips, for example.

In this case, the projection exposure apparatus 310 essentially comprises an illumination system 330, a device 340 for receiving and exactly positioning a mask provided with a structure, a so-called reticle 350, which determines the subsequent structures on the wafer 320, a device 360 for retaining, moving and exactly positioning precisely said wafer 320, and an imaging device, namely a projection objective 370, comprising a plurality of optical elements 7 mounted in an objective housing 6 of the projection objective 370 using mounts 390.

In this case, the basic functional principle provides for the structures introduced into the reticle 350 to be imaged onto the wafer 320; the imaging is generally performed in demagnifying fashion.

After an exposure has taken place, the wafer 320 is moved further in the arrow direction, such that a multiplicity of individual fields, each having the structure predefined by the reticle 350, are exposed on the same wafer 320. On account of the step-by-step advancing movement of the wafer 320 in the projection exposure apparatus 310, the latter is often also referred to as a stepper.

The illumination system 330 provides a projection beam 410 used for the imaging of the reticle 350 on the wafer 320, for example light or a similar electromagnetic radiation. A laser or the like can be used as a source of this radiation. The radiation is shaped in the illumination system 330 using optical elements in such a way that the projection beam 410 has the desired properties with regard to diameter, polarization, shape of the wavefront and the like upon impinging on the reticle 350.

Using the beams 410, an image of the reticle 350 is generated and transferred to the wafer 320 in correspondingly demagnified fashion by the projection objective 370, as has already been explained above. The projection objective 370 has a multiplicity of individual refractive, defractive and/or reflective optical elements 7, such as e.g. lenses, mirrors, prisms, terminating plates and the like.

Figure 2:
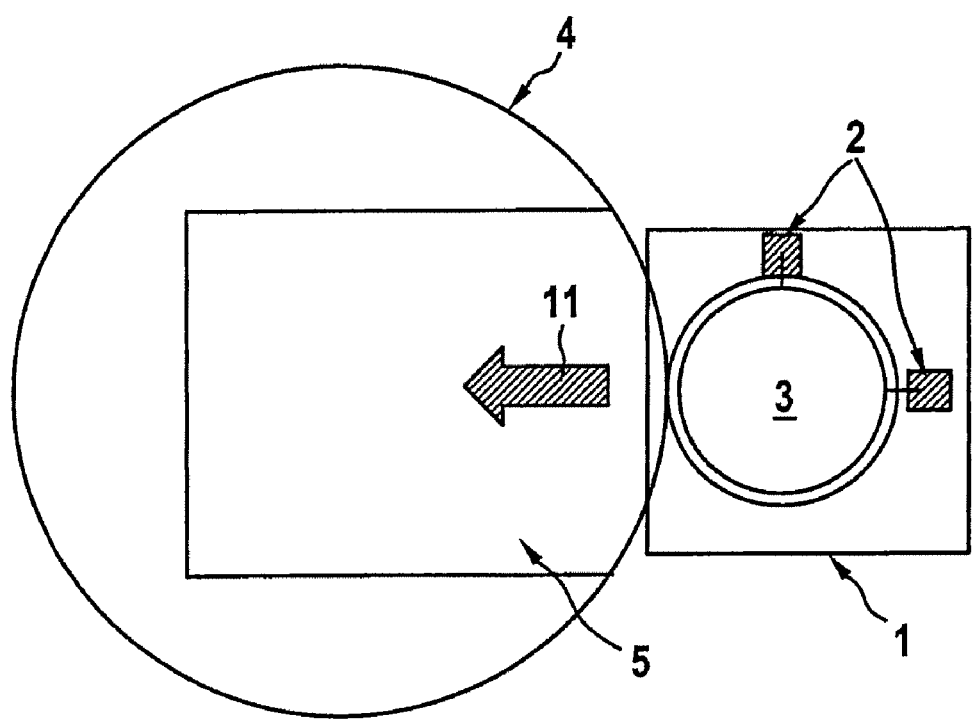
FIG. 2 shows a schematic illustration of a changeable assembly comprising damping elements.

FIG. 2 shows a basic illustration of a first embodiment of a mounting solution. FIG. 2 illustrates a basic mount 4 such as is used in projection exposure apparatuses for semiconductor lithography. The basic mount 4 has a cut-out 5, into which the changeable mount 1 can be inserted in the direction of the arrow 11. In this case, the changeable mount 1 contains the optical element 3 and the damping elements 2. The damping elements 2 can be for example active or passive dampers or else dampers embodied as manipulators in the manner of the system described in the published German patent application DE 100 225 266 A1. The damping elements 2 can be connected to the changeable mount 1 using threaded holes, for example.

Figure 3:
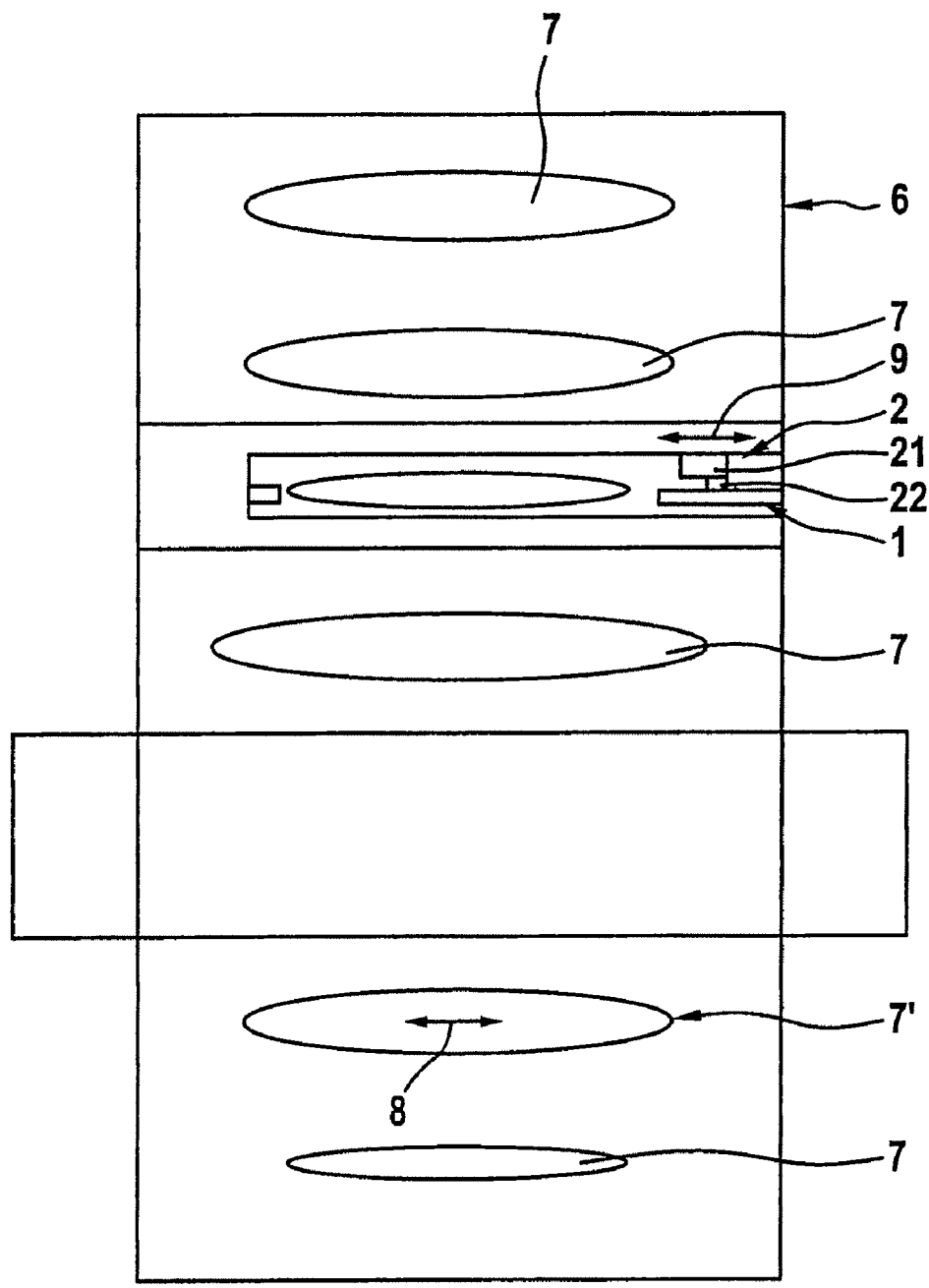
FIG. 3 shows a basic schematic diagram of an embodiment of a projection objective.

FIG. 3 shows an objective housing 6 of a projection objective for semiconductor lithography comprising a plurality of optical elements 7 and 7', which are embodied as lenses in the present example, and an insert opening (not designated in the figure), into which the changeable mount 1 having the optical element 3 is inserted. Besides the optical element 3, the changeable mount 1 has the damping element 2, which is embodied as a passive damping element comprising a mass element 21 and also an elastic element 22 in the present example. In the case of a vibration of the optical element 7' with its natural frequency in the direction of the arrow 8, the vibration of the optical element 7' is regularly transmitted further via the coupling to the objective housing 6. As a result, further components arranged in the objective housing 6, that is to say in particular also the changeable mount 1 with the damping element 2, are also caused to vibrate with the same frequency as the natural frequency of the optical element 7'. In this case, this vibration results in a shear movement of the elastic element 22 in the damping element 2, said shear movement being indicated by the arrow 9. On account of the deviating natural frequencies of the other optical elements 7 and also of the optical element 3, however, the amplitude of this vibration will prove to be smaller than the amplitude of the vibration of the optical element 7' since the latter, after all, vibrates at its natural frequency. A damping of the vibration of the optical element 7' can nevertheless be achieved via the coupling of the damping element 2 via the objective housing 6 and the changeable mount 1. For this purpose, the natural frequency of the damping element 2 should be chosen in accordance with the natural frequency of the optical element 7'.

As an alternative, the damping element 2 can also be designed in such a way that its natural frequency and/or its vibration direction are/is co-ordinated with the natural frequency and/or the vibration direction of the optical element 3 arranged in the changeable mount. What is thereby achieved is that the damping elements 2 primarily damp vibrations of the optical element 3.

The arrangement illustrated in FIG. 2 thus makes it possible to provide a type of modular system in which a wide variety of damping elements 2 are provided which are tuned to the corresponding problem frequencies that occur during operation of the projection exposure apparatus. Embodiments thus makes it possible to rapidly retrofit an application-specific damping function in production operation of the projection exposure apparatus. The desired damping can therefore also be adapted to individual objectives, apparatuses or else process parameters, such as the reticle speed, for example, in particular when dynamic range problems such as a loss of contrast, for example, occur after a change to the exposure process. In such cases, embodiments make it possible to solve such problems within a few days or, if applicable, hours without demounting the objective.

The invention claimed is:

1. A projection exposure apparatus for semiconductor lithography, comprising:
   at least one changeable assembly, comprising at least one damping element and containing at least one optical element, the changeable assembly being embodied in such a way that the assembly can be changed in a time period of less than 12 hours,
   wherein the natural frequency of the damping element is coordinated with a natural frequency of an optical element outside the changeable assembly.

2. The projection exposure apparatus of claim 1, wherein the damping element is a passive damping element.

3. The projection exposure apparatus of claim 2, wherein the damping element has a mass element connected to an elastic element.

4. The projection exposure apparatus of claim 3, wherein the elastic element is connected to the mass element in such a way that the damping element can perform a shear movement.

5. The projection exposure apparatus of claim 3, wherein the mass element has a mass in the range of 150 g-450 g.

6. The projection exposure apparatus of claim 2, wherein the elastic element is produced from a fluoroelastomer.

7. The projection exposure apparatus of claim 1, wherein the damping element is an active damping element with a sensor and an actuator.

8. The projection exposure apparatus of claim 7, wherein the damping element comprises a plunger-type coil.

9. The projection exposure apparatus of claim 7, wherein the damping element comprises piezoelements.

10. The projection exposure apparatus of claim 1, wherein the damping element is provided with a cooling device.

11. The projection exposure apparatus of claim 1, wherein the changeable assembly is an insert element.

12. The projection exposure apparatus of claim 1, wherein the damping element is designed for damping vibrations having a frequency in the range of 10 Hz-800 Hz.

13. The projection exposure apparatus of claim 1, wherein the natural frequency of the damping element is approximately 95% of a natural frequency of the projection objective.

14. The projection exposure apparatus of claim 1, wherein the changeable assembly is arranged in an insert opening.

* * * * *